(12) United States Patent
Krajec (10) Patent No.: US 6,262,571 B1
(45) Date of Patent: Jul. 17, 2001

(54) ADJUSTABLE ELECTRICAL CONNECTOR FOR TEST FIXTURE NEST

(75) Inventor: Russell S. Krajec, Berthould, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 09/442,434

(22) Filed: Nov. 17, 1999

(51) Int. Cl.[7] .................................................. G01R 31/02
(52) U.S. Cl. ...................... 324/158.1; 324/762; 324/755; 439/66
(58) Field of Search ............................... 324/158.1, 755, 324/754, 762; 439/482, 66; 29/749

(56) References Cited

U.S. PATENT DOCUMENTS

| | | | |
|---|---|---|---|
| 3,891,924 | * 6/1975 | Ardezzone et al. | 324/158.1 |
| 4,365,195 | * 12/1982 | Stegens | 324/158.1 |
| 4,505,034 | * 3/1985 | Reidt | 29/749 |
| 4,686,463 | * 8/1987 | Logan | 324/158.1 |
| 4,707,656 | * 11/1987 | Marzan | 324/158.1 |
| 4,808,919 | * 2/1989 | Sylviane et al. | 324/158.1 |
| 4,866,375 | 9/1989 | Malloy | 324/158 |
| 4,939,454 | 7/1990 | Miner | 324/158 |
| 4,961,050 | 10/1990 | Harwood et al. | 324/158 |
| 5,017,865 | * 5/1991 | Oldfield | 324/158.1 |
| 5,153,505 | 10/1992 | Abita et al. | 324/158 |
| 5,252,916 | 10/1993 | Swart | 324/158 |
| 5,300,881 | 4/1994 | Ferrer et al. | 324/158 |
| 5,321,351 | 6/1994 | Swart et al. | 324/158 |
| 5,408,189 | 4/1995 | Swart et al. | 324/758 |
| 5,416,405 | 5/1995 | Dill | 324/72.5 |
| 5,436,567 | 7/1995 | Wexler et al. | 324/754 |
| 5,492,223 | 2/1996 | Boardman et al. | 206/710 |
| 5,506,513 | * 4/1996 | Bacher | 324/755 |
| 5,572,144 | 11/1996 | Davidson et al. | 324/755 |
| 5,575,076 | 11/1996 | Creeden | 33/620 |
| 5,629,838 | 5/1997 | Knight et al. | 361/782 |
| 5,715,167 | 2/1998 | Gupta et al. | 364/474.28 |
| 5,923,181 | 7/1999 | Beilstein, Jr. et al. | 324/758 |
| 6,005,405 | 12/1999 | Slutz | 324/761 |
| 6,043,669 | 3/2000 | Carroll | 324/761 |
| 6,066,957 | 5/2000 | Van Loan et al. | 324/758 |

* cited by examiner

*Primary Examiner*—Safet Metjahic
*Assistant Examiner*—Jimmy Nguyen (57) ABSTRACT

An adjustable electrical connector having a rigid or spring-loaded conductive element and a cable coupled to the conductive element. The adjustable electrical connector provides electrical connection to a device under test held in place on a test fixture nest, transferring an electrical signal such as a power source from the cable to the device under test through the conductive element. The adjustable electrical connector may be secured to the test fixture nest in a number of different positions to easily accommodate different types of devices under test.

20 Claims, 5 Drawing Sheets

ADJUSTABLE ELECTRICAL CONNECTOR FOR TEST FIXTURE NEST

REFERENCE TO RELATED APPLICATION

The present application is related to United States patent application of Russell S. Krajec and Wallace J. Lannen, filed on even date herewith, and entitled "Signal Transfer Device for Probe Test Fixture," which is incorporated herein by reference as if fully set forth.

FIELD OF THE INVENTION

The present invention relates to an adjustable connector for providing electrical connection to a device under test on a test fixture nest.

BACKGROUND OF THE INVENTION

Certain devices are more easily tested and worked on while held securely in position. For example, when performing maintenance on cellular telephones, a person more easily may work with the telephone if it is held securely in position. In addition, holding the device under test in position serves to protect it from potential damage while being worked on. Also, certain types of test apparatus require that the device under test be securely held in position in order to connect the test apparatus to it. For certain applications, a nest plate may be custom-made to securely hold a particular device under test. In order to customize a nest plate, the device under test is measured, and appropriate configuration and machining is made of the nest plate to accommodate the device under test with a mechanism to securely hold it in place, such as nest pins located in predetermined locations.

In addition, a device under test sometimes requires electrical connection for testing. Therefore, in addition to securely holding the device under test in position, a mechanism must be provided for permitting electrical connection to the device under test. Moreover, certain devices require that they be elevated above a nest plate such as for providing electrical connection to contacts on their underside. Therefore, the nest plate sometimes must include a custom-made mechanism for raising a device under test above the nest plate. Also, some devices under test require connection with a printed circuit board (PCB) for testing, and others require shielding from radio frequency (RF) electromagnetic energy. Additional apparatus must be provided in those situations for the connection or RF shielding.

Accordingly, a need exists for an improved mechanism and method for providing electrical connection with a device under test while positioned on a nest plate.

SUMMARY OF THE INVENTION

An adjustable electrical connector consistent with the present invention may be used to provide electrical connection to a device under test. It includes a base for placement against a nest plate having a plurality of nest apertures, and the base defines an elongated aperture for use in adjustably securing the base to the nest plate using a fastener positioned in the elongated aperture and connected to one of the nest apertures. The adjustable electrical connector also includes a probe portion having first and second ends, the first end of the probe portion being connected to the base and the second end of the probe portion extending away from the nest plate when the base is secured to the one nest aperture. The probe portion includes a conductive element having a first end at the second end of the probe portion for electrical connection with the device under test and having a second end connected to a cable extending from the second end of the probe portion for transferring an electrical signal.

A test fixture assembly consistent with the present invention may be used to provide electrical connection to a device under test while held on a nest plate. The test fixture assembly includes a nest plate having a plurality of nest apertures and further includes a plurality of nest elements for selective connection to the plurality of nest apertures for holding a device under test on the nest plate. An adjustable electrical connector provides electrical to the device under test while held on the nest plate. The adjustable electrical connector includes a base for placement against a nest plate having a plurality of nest apertures, and the base defines an elongated aperture for use in adjustably securing the base to the nest plate using a fastener positioned in the elongated aperture and connected to one of the nest apertures. The adjustable electrical connector also includes a probe portion having first and second ends, the first end of the probe portion being connected to the base and the second end of the probe portion extending away from the nest plate when the base is secured to the one nest aperture. The probe portion includes a conductive element having a first end at the second end of the probe portion for electrical connection with the device under test and having a second end connected to a cable extending from the second end of the probe portion for transferring an electrical signal.

A method consistent with the present invention may be used to provide electrical connection to a device under test on a nest plate. Under the method, a nest plate is provided having nest elements for use in nesting a device under test having an electrical connector for transferring an electrical signal. An adjustable electrical connector, having a conductive element and a cable connected with the conductive element, is positioned so that the conductive element contacts the electrical connector when the device under test is nested on the nest plate, and the adjustable electrical connector is secured to the nest plate using a fastener.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
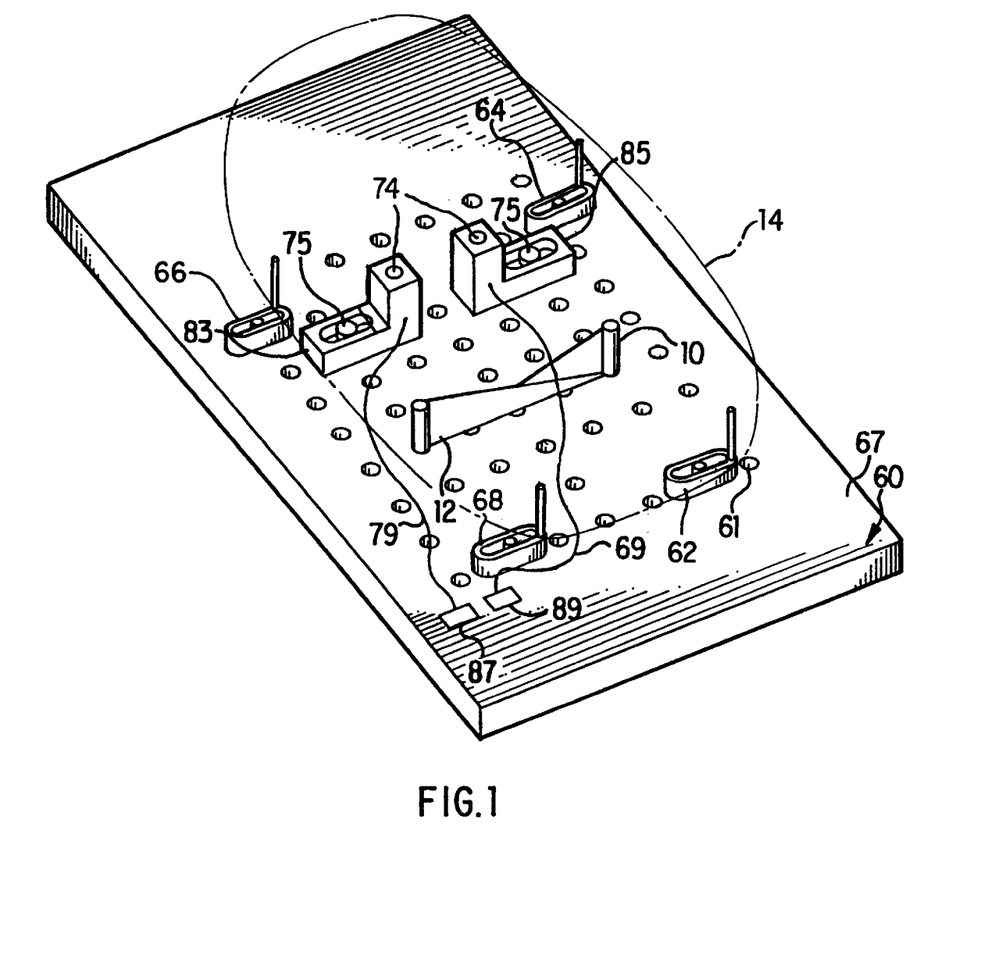
FIG. 1 is a perspective diagram of adjustable electrical connectors used with a device under test on an exemplary test fixture nest.

FIG. 1 is a perspective diagram of a test fixture assembly including adjustable electrical connectors 83 and 85 to provide electrical connection to a device 14 under test on a nest plate 60. Device 14 for use with adjustable electrical connectors 83 and 85 may include any type of device adapted to send or receive an electrical signal, and adjustable electrical connectors 83 and 85 may be used with any device having an electrical connector for sending or receiving an electrical signal; examples include, but are not limited to, control modules, communications devices such as cellular telephones, and printed circuit boards. Adjustable electrical connectors 83 and 85 are adjustable so that they may be easily located in a position for providing an electrical signal connection to device 14 and, if necessary, moved to a different position for providing an electrical signal connection to a device requiring different placement for sending or receiving an electrical signal. Adjustable electrical connectors 83 and 85 each include rigid or spring-loaded conductive elements 74 for providing an electrical connection to device 14 while under test, and they also include cables 79 and 69, respectively, connected to conductive elements 74. In FIG. 1, device 14 is shown in phantom in order to illustrate use of adjustable electrical connectors 83 and 85 beneath it.

Adjustable electrical connectors 83 and 85 are electrically connected to terminals 87 and 89 by cables 79 and 69, respectively. A power source or other electrical signal is provided by connection to terminals 87 and 89. For example, two adjustable electrical connectors may be used to simulate a battery connection for a cellular telephone or other device, and six adjustable electrical connectors may be used to simulate an SIM connection on a Global System for Mobile communications (GSM) cellular telephone. Many other uses of the adjustable electrical connectors are possible. Therefore, cables 79 and 69 transfer an electrical signal to adjustable electrical connectors 83 and 85, which in turn provide the signal for transfer to device 14 via conductive elements 74. Cables 79 and 69 may be implemented with any type of electrical connection such as, for example, an insulated wire. Terminals 87 and 89 may be implemented with any mechanism for sending or receiving an electrical signal and may be located on nest plate 60, as shown in FIG. 1, or elsewhere off nest plate 60. Although only two terminals 87 and 89 are shown in FIG. 1, more or fewer terminals may be used as required or desired for a particular use of an adjustable electrical connector.

Adjustable electrical connectors 83 and 85 are adjustable so that they may be positioned for contacting terminals or other electrical connections associated with device 14. In operation, device 14 is held in place and above nest plate 60, and further held against adjustable electrical connectors 83 and 85 for receiving an electrical signal from them or sending an electrical signal to them. In particular, nest plate 60 has a top surface 67 and includes a plurality of nest apertures 61, typically implemented with threaded holes. Nest plate 60 may be implemented with, for example, plated steel sheet metal or with any material to accommodate threaded holes or other apertures for use in securing nest elements. Fasteners 75 in adjustable electrical connectors 83 and 85 mate with selected ones of nest apertures 61 in order to adjustably secure adjustable electrical connectors 83 and 85 to nest plate 60. Device 14 is nested on top surface 67 of nest plate 60 using a plurality of nest elements, which includes any mechanism to securely hold a device on a nest plate. In this example, nest elements include stop blocks 62, 64, 66, and 68, which securely hold device 14 in place above or on nest plate 60 by either contacting device 14, or closely contacting it, in order to securely hold it at a sufficient number of contact points.

Stop blocks 62, 64, 66, and 68 may have the same configuration as adjustable electrical connectors 83 and 85, as described below, without the mechanism for providing an electrical signal. Alternatively, nest elements may be implemented with, for example, nest pins for selective placement within nest apertures 61 of nest plate 60 or with a customized nest plate having nest elements at predefined locations on nest plate 60. Nest elements may also optionally include ramps 10 and 12 used to contact a bottom surface of device 14 and elevate it above top surface 67 of nest plate 60 in order to assist in positioning device 14 against adjustable electrical connectors 83 and 85. Ramps 10 and 12 may be implemented with angled pieces, as shown in FIG. 1, secured to nest plate 60 using fasteners mating with selected nest apertures 61 in nest plate 60. Ramps 10 and 12 may have varying lengths in order to accommodate particular devices to be nested. The nest elements, including stop blocks 62, 65, 66, and 68, and ramps 10 and 12, may be implemented with a non-conductive material such as, for example, a molded non-conductive plastic, a machined plastic, and a fiberglass reinforced epoxy laminate. These types of materials are also usually non-abrasive to prevent damage to device 14 while under test.

With ramps 10 and 12 and stop blocks 62, 64, 66, and 68 in position, device 14 is held in place above nest plate 60 and against adjustable electrical connectors 83 and 85 for sending or receiving an electrical signal. Device 14 includes electrical connectors to contact conductive element 74 when adjustable electrical connector 83 is in use. Also, certain types of devices 14 may have spring-loaded connectors requiring contact with a power source for testing when a battery, for example, is removed from the device. In that exemplary situation, a pair of adjustable electrical connectors 83 and 85 provide a connection for transmitting power to device 14. Therefore, device 14 may be easily tested or otherwise worked upon while its battery is removed. Adjustably electrical connector 85 may have the same elements as adjustable electrical connector 83 except that its cable, if necessary or desired, may extend from an opposite side of it in comparison with adjustable electrical connector 83.

Device 14 is easily removed from nest plate 60 by lifting it off nest plate 60. In addition, other devices having the same configuration as device 14 may also be located within customized nest plate 60 with the nest elements installed. Stop blocks 62, 64, 66, and 68, and ramps 10 and 12, are shown only to illustrate an exemplary use of adjustable electrical connectors 83 and 85 providing an electrical signal to device 14. Adjustable electrical connectors 83 and 85 may be used with any mechanism to nest a device under test or without a nesting mechanism as required or desired. Also, adjustable electrical connectors 83 and 85 may be used in any type of environment requiring transfer of signals for testing; examples of such environments include, but are not limited to, a research and development laboratory, a production assembly facility, a service depot, and a point of sale tester. Certain implementations of adjustable electrical connector 83 are referred to as a tugboat stop block.

Figure 2:
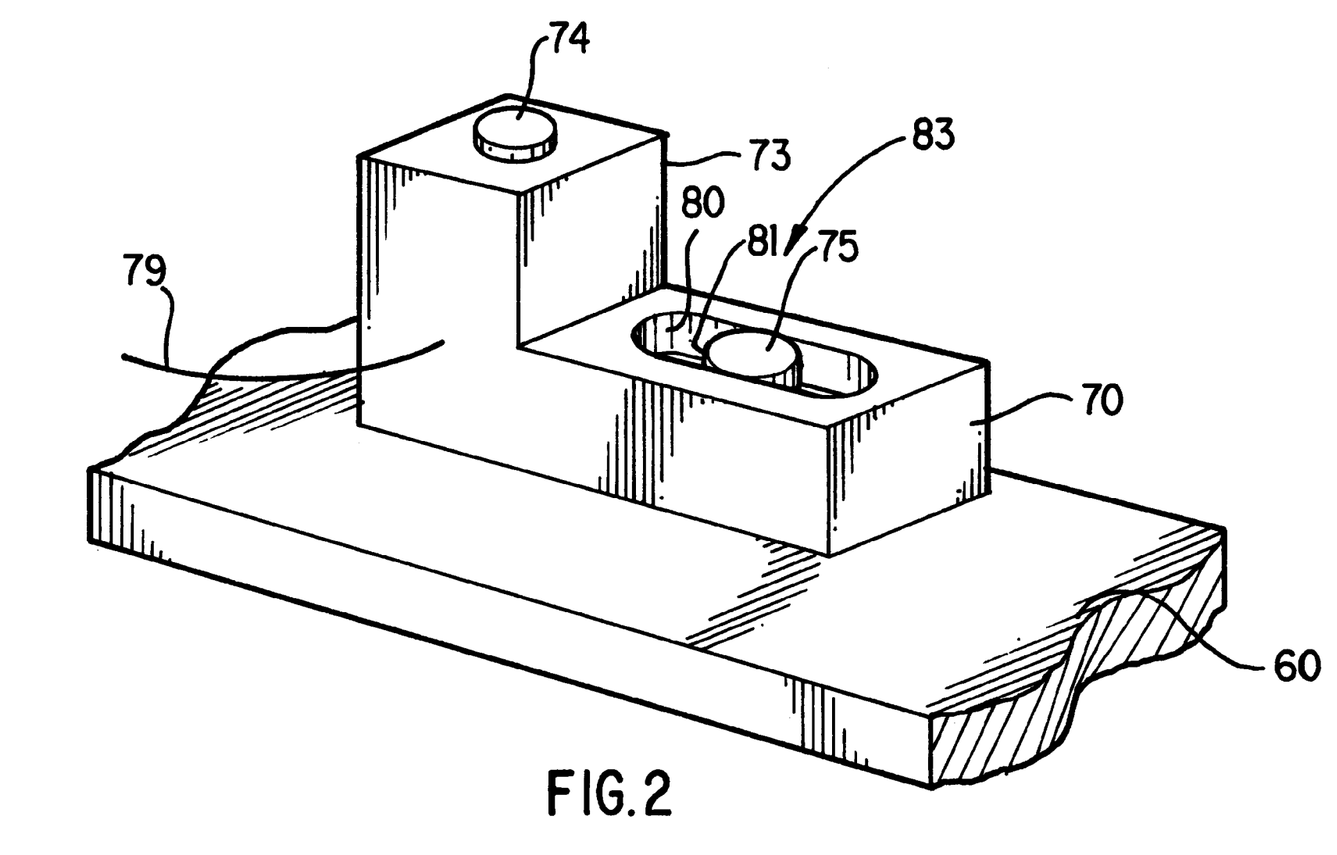
FIG. 2 is a perspective view of a first embodiment of an adjustable electrical connector for use with a device under test.
Figure 3:
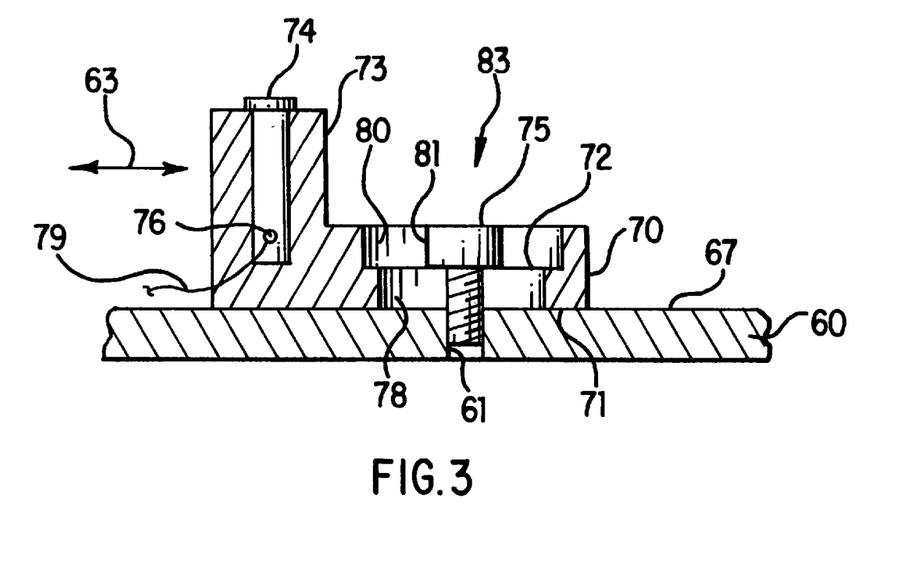
FIG. 3 is a side view of a first embodiment of an adjustable electrical connector for use with a device under test.
Figure 4:
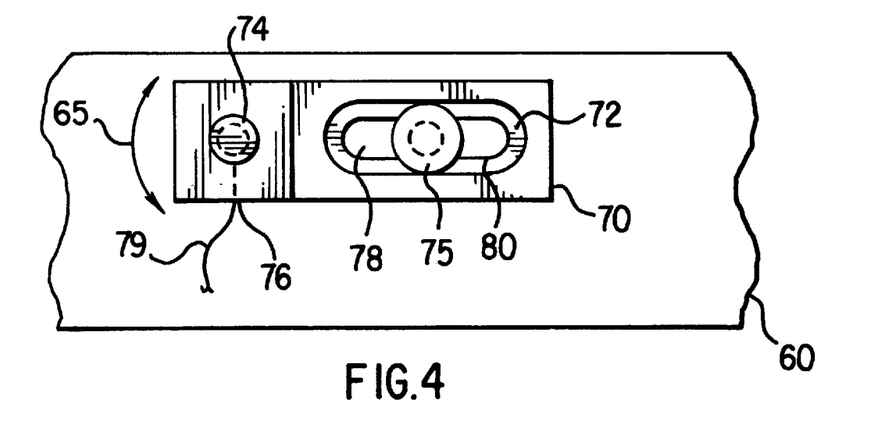
FIG. 4 is a top view of a first embodiment of an adjustable electrical connector for use with a device under test.

FIGS. 2, 3, and 4 illustrate perspective, side, and top views, respectively, of a first embodiment of adjustable electrical connector 83 having a rigid conductive element 74. As shown in FIGS. 2, 3, and 4, adjustable electrical connector 83 includes a base 70 and a probe portion 73 including a conductive element 74 securely located in probe portion 73. Conductive element 74 may be implemented with a metal pin, for example, or any type of element for transferring an electrical signal. Conductive element 74 is connected to cable 79 through an aperture 76 in probe portion 73, as shown in FIGS. 2 and 3. Cable 79 may be permanently connected with conductive element 74 such as with solder connection, or cable 79 may be removably connected with conductive element 74 such as with a port in probe portion 73 receiving an electrical plug on cable 79 to contact conductive element 74.

As shown in FIGS. 2 and 3, an end of conductive element 74 for providing an electrical signal to device 14 may extend from a top surface of probe portion 73 for facilitating electrical connection with electrical connectors on device 14 in the first embodiment. Alternatively, conductive element 74 may be located flush with the top of probe portion 73 or recessed within probe portion 73 in the first embodiment. For example, various types of electrical connectors on a device under test may more easily mate with a conductive element that is flush with or recessed within adjustable electrical connector 83. In addition, although conductive element 74 is shown as a cylindrical pin, it may have other cross-sectional shapes, such as square or rectangular, and may have other elongated shapes for placement within probe portion 73.

As shown in FIGS. 2, 3, and 4, probe portion 73 is shown with a square cross-sectional shape for illustrative purposes only, and it may have other configurations as well. For example, it may have a round, oval, or rectangular cross-sectional shape, and it may be made from one piece, as shown, or from multiple pieces. Probe portion 73 is typically implemented with a non-conductive material for shielding and insulating conductive element 74; examples of such materials include a molded non-conductive plastic, a machined plastic, and a fiberglass reinforced epoxy laminate. Also, use of a non-abrasive material such as plastic helps to ensure that device 14 is not scratched or otherwise damaged by adjustable electrical connector 83.

As shown in FIG. 3, and partly in FIGS. 2 and 4, base 70 includes a bottom surface 71 for placement on top surface 67 of nest plate 60. Base 70 also includes an elongated aperture formed by apertures 78 and 80 joining to create a ridge 72. Therefore, by locating fastener 75 within aperture 78 and 80, a head 81 of fastener 75 is positioned against ridge 72 such that downward force of head 81 against ridge 72 securely locates base 70 on top surface 67 through friction between bottom surface 71 of adjustable electrical connector 83 and top surface 67 of nest plate 60. By loosening fastener 75, a position of adjustable electrical connector 83 may be changed in a lateral direction as shown by arrows 63 in FIG. 3 in order to position it for providing electrical connection to device 14. Once positioned, fastener 75 may again be tightened within nest aperture 61 in order to supply sufficient pressure on ridge 72 to securely locate base 70, and hence adjustable electrical connector 83, on top surface 67 of nest plate 60.

As shown in FIG. 4 in the top view of adjustable electrical connector 83, by loosening fastener 75, adjustable electrical connector 83 may be moved in a radial direction as shown by arrows 65 in order to position it for providing electrical connection to device 14. Once properly positioned, fastener 75 may be tightened sufficiently within nest aperture 61 such that downward force of head 81 against ridge 72 securely holds adjustable electrical connector 83 in place through the use of friction between bottom surface 71 of adjustable electrical connector 83 and top surface 67 of nest plate 60. Therefore, through locating and positioning each of the adjustable electrical connectors 83, electrical connection may be provided to device 14 for transferring an electrical signal to device 14.

Fastener 75 for use with adjustable electrical connector 83 may include a screw for mating with one of the nest apertures 61 in nest plate 60, as shown in FIG. 3. The screw may include, for example, a rounded head 81 compatible with an Allen wrench, or any type of screw compatible with other types of tools for securing adjustable electrical connector 83 to nest plate 60. It may also include fasteners for mating with non-threaded apertures in nest plate 60. The use of two apertures 78 and 80 forming ridge 72 permits a top of head 81 to be flush with a top surface of base 70, as shown in FIGS. 2 and 3. Apertures 78 and 80 may be configured so that head 81 is located above or recessed within aperture 80. Also, base 70 may use only a single aperture with head 81 of fastener 75 used to apply downward pressure to the top surface of base 70. Apertures 78 and 80 may have an elongated shape with rounded ends, as shown in FIGS. 2, 3, and 4, or other configurations as they need only accommodate fastener 75, or other type of fastener, and permit the fastener to adjustably secure base 70 to nest plate 60.

Base 70 is typically implemented using a non-conductive material, the same as for probe portion 73. Examples of such materials include a molded non-conductive plastic, a machined plastic, and a fiberglass reinforced epoxy laminate. Base 70 may be implemented with a different material than probe portion 73, even a conductive material, such as an alloy, joined with probe portion 73 having a non-conductive material. Also, base 70 may be integrally formed with probe portion 73 from one piece of material, or base 70 may be a separate piece connected with probe portion 73. Base 70 and probe portion 73 may be formed or joined at a right angle, as shown in FIGS. 2 and 3, or formed at different angles; probe portion 73 need only extend away from base 70 when base 70 is secured to nest plate 60 so that probe portion 73 may be position for provided electrical connection with device 14. In addition, although base 70 is shown as having a rectangular shape in the side view (FIG. 3) and the top view (FIG. 4), it may have other shapes or configurations.

Figure 5:
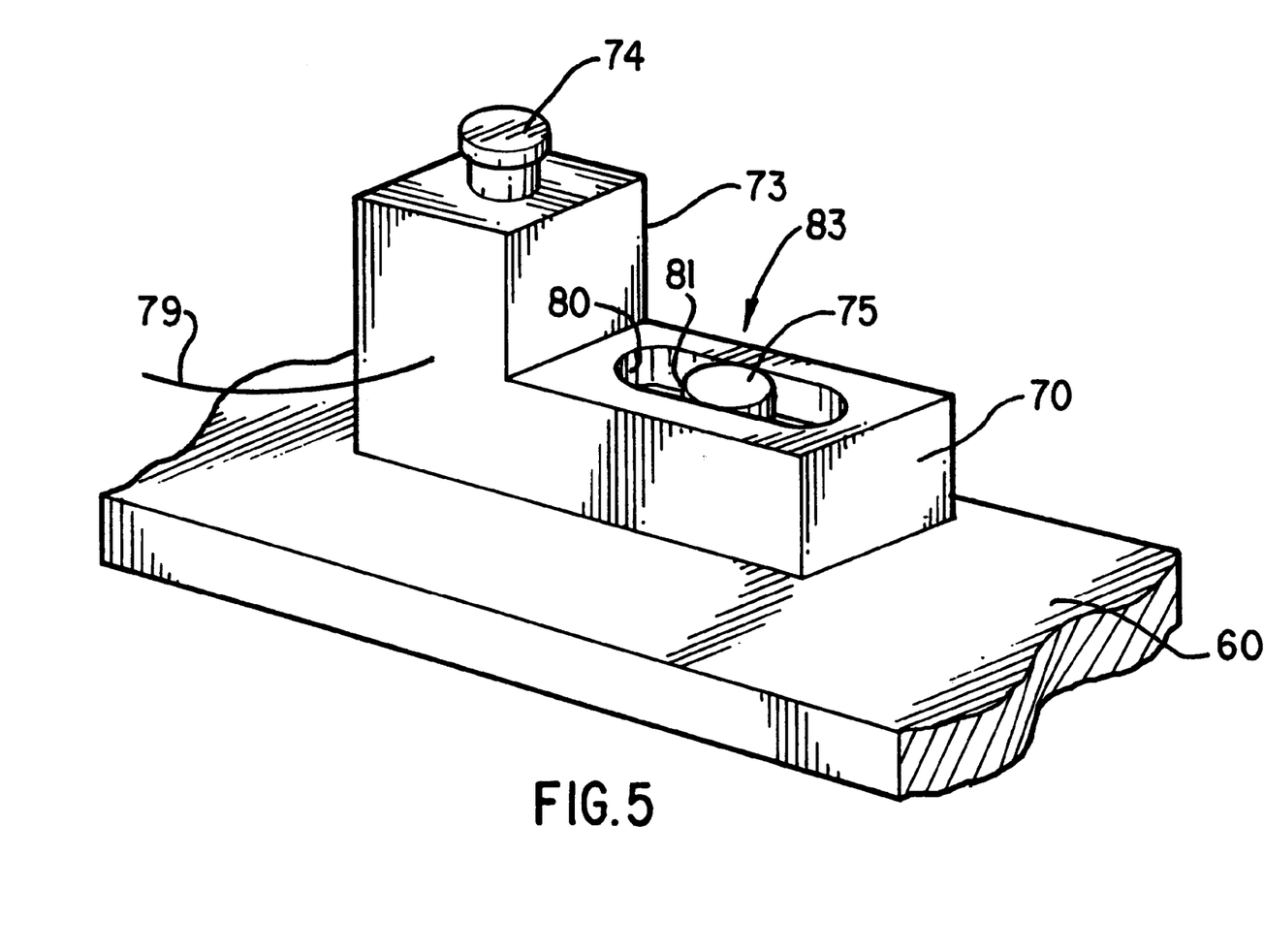
FIG. 5 is a perspective view of a second embodiment of an adjustable electrical connector for use with a device under test.
Figure 6:
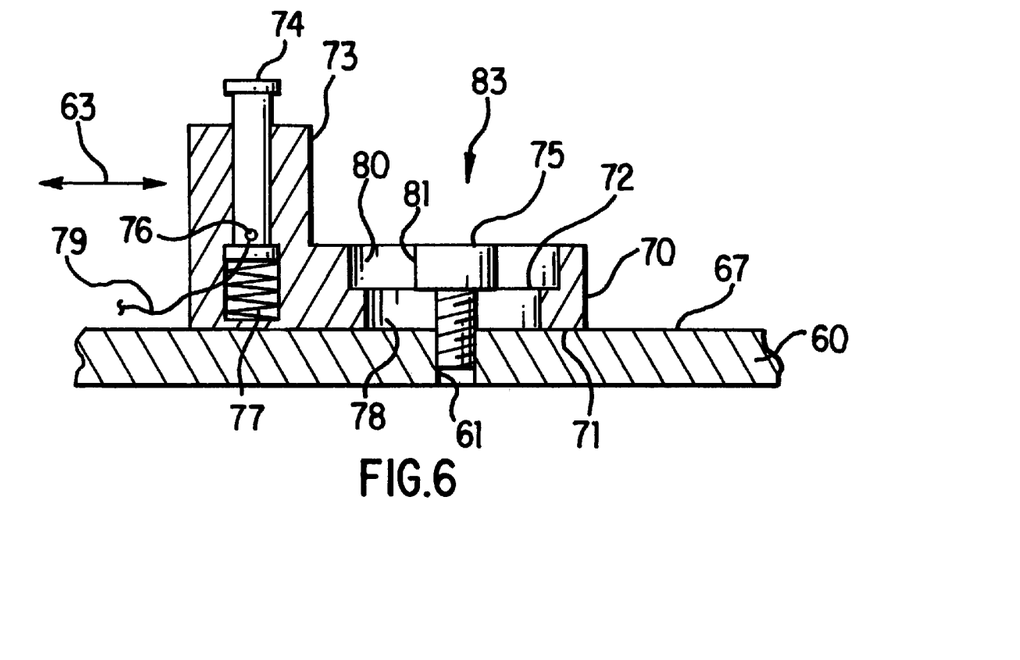
FIG. 6 is a side view of a second embodiment of an adjustable electrical connector for use with a device under test.
Figure 7:
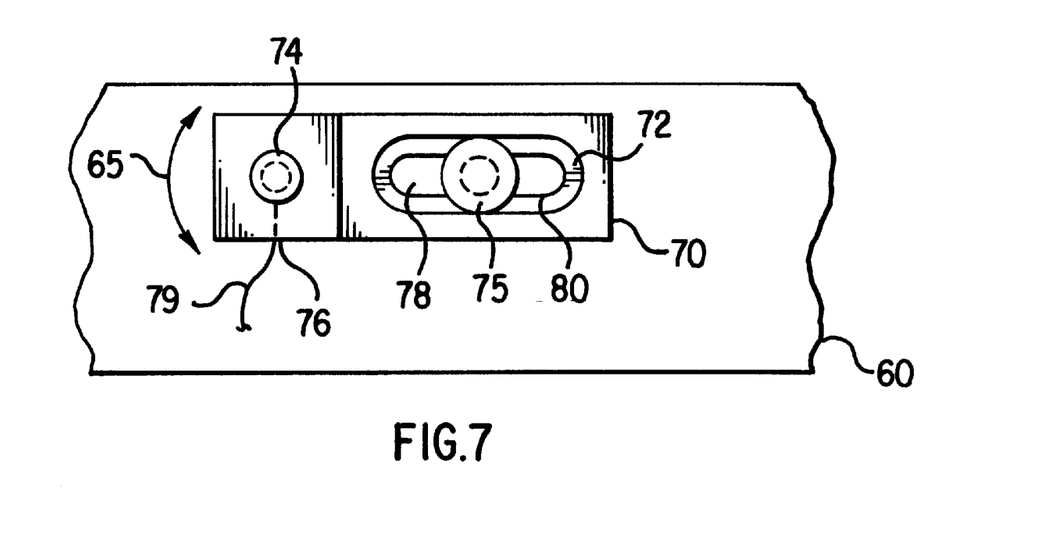
FIG. 7 is a top view of a second embodiment of an adjustable electrical connector for use with a device under test.

FIGS. 5, 6, and 7 illustrate perspective, side, and top views, respectively, of a second embodiment of adjustable electrical connector 83 having a spring-loaded conductive element 74. The spring-loading of conductive element 74 provides for upward force, away from base 70, on conductive element 74 and thus assists in providing a connection with an electrical connector on device 14. In particular, the spring-loading helps to hold conductive element 74 against an electrical connector within device 14. The spring-loading includes a spring 77 located within probe portion 73 and situated to apply force against conductive element 74 in a direction extending away from the top surface of probe portion 73. Conductive element 74 in the second embodiment, as shown in FIGS. 5 and 6, has a different configuration, including a flanged portion within probe portion 73, in order to accommodate the spring loading and secure conductive element 74 in probe portion 73. Aside from spring 77 providing the spring loading and a possibly different configuration of conductive element 74 to accommodate the spring loading, the reference numbers in second embodiment shown in FIGS. 5, 6, and 7 having the same description and function as provided above with respect to the first embodiment shown in FIGS. 2, 3, and 4.

Each of the adjustable electrical connectors 83 and 85, whether including a rigid or spring-loaded conductive element 74, may be individually positioned one at a time for providing an electrical signal to device 14, as shown in FIG. 1. Alternatively, adjustable electrical connectors 83 and 85 may be generally positioned for providing the electrical signal to device 14 and individually adjusted and secured against nest plate 60. Therefore, adjustable electrical connectors 83 and 85 provide, for example, a low cost mechanism providing electrical connection to device 14 under test and capable of being easily moved to various positions to set-up a device under test. Also, two adjustable electrical connectors 83 and 85 are shown for providing an electrical signal to device 14 since the signal is typically a power source requiring two connections; however, more or fewer adjustable electrical connectors 83 and 85 may be used for providing an electrical signal to a device as required or desired for a particular situation.

In addition, adjustable electrical connector 83 may be used in a method of providing electrical connection to device 14 when under test on nest plate 60, as illustrated in FIG. 1. Under the exemplary method, nest plate 60 is provided having nest elements 62, 64, 66, and 68, and ramps 10 and 12, for use in nesting device 14 having an electrical connector for transferring an electrical signal. Adjustable electrical connector 83, having conductive element 74 and cable 79 connected with conductive element 74, is positioned so that conductive element 74 contacts the electrical connector in device 14 when it is nested on nest plate 60, and adjustable electrical connector 83 is secured to nest plate 60 using fastener 75. The exemplary method may also include providing spring loading to conductive element 74 using spring 77 for forcing conductive element 74 against the electrical connector in device 14 when it is nested on nest plate 60.

While the present invention has been described in connection with an exemplary embodiment, it will be understood that many modifications will be readily apparent to those skilled in the art, and this application is intended to cover any adaptations or variations thereof. For example, different labels for the various components, types of materials, and configurations may be used without departing from the scope of the invention. This invention should be limited only by the claims and equivalents thereof.

What is claimed is:

1. An adjustable electrical connector for providing electrical connection to a device under test, comprising:
   a base for placement against a nest plate having a plurality of nest apertures, the base defining an elongated aperture for use in adjustably securing the base to the nest plate using a fastener positioned in the elongated aperture and connected to one of the nest apertures; and
   a probe portion having first and second ends, the first end of the probe portion being connected to the base and the second end of the probe portion extending away from the nest plate when the base is secured to the one nest aperture, the probe portion including a conductive element having a first end at the second end of the probe portion for electrical connection with the device under test, the conductive element further having a second end connected to a cable extending from the second end of the probe portion for transferring an electrical signal,
   wherein the probe portion is formed from a non-conductive material.

2. The adjustable electrical connector of claim 1 wherein the base defines the elongated aperture with a ridge so that the fastener is recessed within the base when secured to the nest plate.

3. The adjustable electrical connector of claim 1 wherein the conductive element includes a rigid pin secured within the probe portion.

4. The adjustable electrical connector of claim 1 wherein the conductive element is spring loaded within the probe portion.

5. The adjustable electrical connector of claim 1 wherein the probe portion extends from the base at a right angle.

6. The adjustable electrical connector of claim 1 wherein the base and the probe portion are integrally formed from one piece of a material.

7. The adjustable electrical connector of claim 1 wherein the base is formed from a non-conductive material.

8. The adjustable electrical connector of claim 1 wherein the first end of the conductive element extends from the second end of the probe portion.

9. The adjustable electrical connector of claim 1 wherein the elongated aperture provides for movement of the base in a lateral direction and a radial direction in order to be adjustably secured on the nest plate using the fastener.

10. A test fixture assembly for providing electrical connection to a device under test while held on a nest plate, comprising:
    a nest plate including a plurality of nest apertures;
    a plurality of nest elements for selective connection to the plurality of nest apertures for holding a device under test on the nest plate; and
    an adjustable electrical connector for providing electrical connection to the device under test while held on the nest plate, the adjustable electrical connector including:
       a base for placement against the nest plate, the base defining an elongated aperture for use in adjustably securing the base to the nest plate using a fastener positioned in the elongated aperture and connected to one of the nest apertures; and
       a probe portion having first and second ends, the first end of the probe portion being connected to the base and the second end of the probe portion extending away from the nest plate when the base is secured to the one nest aperture, the probe portion including a conductive element having a first end at the second end of the probe portion for electrical connection with the device under test, the conductive element further having a second end connected to a cable extending from the second end of the probe portion for transferring an electrical signal,
    wherein the probe portion is formed from a non-conductive material.

11. The test fixture assembly of claim 10 wherein the base defines the elongated aperture with a ridge so that the fastener is recessed within the base when secured to the nest plate.

12. The test fixture assembly of claim 10 wherein the conductive element includes a rigid pin secured within the probe portion.

13. The test fixture assembly of claim 10 wherein the conductive element is spring loaded within the probe portion.

14. The test fixture assembly of claim 10 wherein the probe portion extends from the base at a right angle.

15. The test fixture assembly of claim 10 wherein the base and the probe portion are integrally formed from one piece of a material.

16. The test fixture assembly of claim 10 wherein the base is formed from a non-conductive material.

17. The test fixture assembly of claim 10 wherein the first end of the conductive element extends from the second end of the probe portion.

18. The test fixture assembly of claim 10 wherein the elongated aperture provides for movement of the base in a lateral direction and a radial direction in order to be adjustably secured on the nest plate using the fastener.

19. A method for use in providing electrical connection to a device under test on a nest plate, comprising:

provide a nest plate having nest elements for use in nesting a device under test having an electrical connector for transferring an electrical signal;

positioning an adjustable electrical connector at least a portion of which is formed from a non-conductive material, having a conductive element and a cable connected with the conductive element, so that the conductive element contacts the electrical connector when the device under test is nested on the nest plate; and securing the adjustable electrical connector to the nest plate using a fastener.

20. The method of claim 19, further including providing spring loading to the conductive element for forcing the conductive element against the electrical connector when the device under test is nested on the nest plate.

* * * * *